United States Patent
Nasu

(10) Patent No.: US 11,400,828 B2
(45) Date of Patent: Aug. 2, 2022

(54) INFORMATION PROCESSING APPARATUS

(71) Applicant: NEC CORPORATION, Tokyo (JP)

(72) Inventor: Yasuyuki Nasu, Tokyo (JP)

(73) Assignee: NEC CORPORATION, Tokyo (JP)

( * ) Notice: Subject to any disclaimer, the term of this patent is extended or adjusted under 35 U.S.C. 154(b) by 243 days.

(21) Appl. No.: 16/284,138

(22) Filed: Feb. 25, 2019

(65) Prior Publication Data

US 2019/0263288 A1 Aug. 29, 2019

(30) Foreign Application Priority Data

Feb. 26, 2018 (JP) .............................. JP2018-031570

(51) Int. Cl.
| | | |
|---|---|---|
| *B60L 53/80* | (2019.01) | |
| *G01R 31/382* | (2019.01) | |
| *H04W 4/024* | (2018.01) | |
| *G05D 1/02* | (2020.01) | |
| *G01C 21/36* | (2006.01) | |

(52) U.S. Cl.
CPC .......... *B60L 53/80* (2019.02); *G01C 21/3679* (2013.01); *G01R 31/382* (2019.01); *G05D 1/0212* (2013.01); *G05D 1/0274* (2013.01); *H04W 4/024* (2018.02); *G05D 2201/0213* (2013.01)

(58) Field of Classification Search
CPC ..... G01C 21/3438; B60L 53/60; B60L 53/62; B60L 53/63; B60L 53/64; B60L 53/65; B60L 53/66; B60L 53/665; B60L 53/67; B60L 53/68

See application file for complete search history.

(56) References Cited

U.S. PATENT DOCUMENTS

| | | | | |
|---|---|---|---|---|
| 2007/0294026 A1* | 12/2007 | Schirmer | .............. | B60W 20/12 340/995.19 |
| 2012/0166240 A1* | 6/2012 | Jones | ..................... | G06Q 20/24 709/227 |
| 2014/0278104 A1* | 9/2014 | Proietty | ............. | G01C 21/3438 701/400 |

(Continued)

FOREIGN PATENT DOCUMENTS

| | | |
|---|---|---|
| JP | 2006-184006 A | 7/2006 |
| JP | 2012-152018 A | 8/2012 |

(Continued)

OTHER PUBLICATIONS

Japanese Office Action for JP Application No. 2018-031570 dated Nov. 30, 2021 with English Translation.

(Continued)

*Primary Examiner* — Peter D Nolan
*Assistant Examiner* — Sara J Lewandroski
(74) *Attorney, Agent, or Firm* — Sughrue Mion, PLLC

(57) ABSTRACT

An information processing apparatus of the present invention includes: an acquisition unit configured to acquire location information of an electric vehicle equipped with a removable and replaceable battery, and acquire the status of the battery installed in the electric vehicle; and a specifying unit configured to specify a place where two or more electric vehicles can meet, on the basis of the location information of each of the electric vehicles and the status of the battery.

9 Claims, 8 Drawing Sheets

(56) References Cited

U.S. PATENT DOCUMENTS

| | | | | |
|---|---|---|---|---|
| 2015/0197154 A1* | 7/2015 | Jones | ................... | B60L 53/665 709/227 |
| 2017/0146354 A1* | 5/2017 | Boss | ................. | G01C 21/3438 |
| 2017/0174092 A1* | 6/2017 | Köhnke | ............... | G05D 1/0088 |
| 2017/0282942 A1* | 10/2017 | Mathews, Jr | .......... | B61L 3/008 |
| 2017/0293296 A1* | 10/2017 | Stenneth | ............. | G06Q 10/047 |
| 2018/0257498 A1* | 9/2018 | Delp | ................. | G01C 21/3469 |
| 2019/0186932 A1* | 6/2019 | Milding | ................. | B60L 58/13 |
| 2020/0254892 A1* | 8/2020 | Hadi | ....................... | B60L 58/12 |
| 2020/0402003 A1* | 12/2020 | ElShenawy | ........... | G01C 21/20 |

FOREIGN PATENT DOCUMENTS

| | | |
|---|---|---|
| JP | 2013-196601 A | 9/2013 |
| JP | 2013-201112 A | 10/2013 |
| JP | 2014-003803 A | 1/2014 |
| JP | 2014-032116 A | 2/2014 |
| JP | 2018-019483 A | 2/2016 |
| JP | 2017-049933 A | 3/2017 |
| WO | 2013/061410 A1 | 5/2013 |

OTHER PUBLICATIONS

Japanese Office Communication for JP Application No. 2018-031570 dated May 17, 2022 with English Translation.

\* cited by examiner

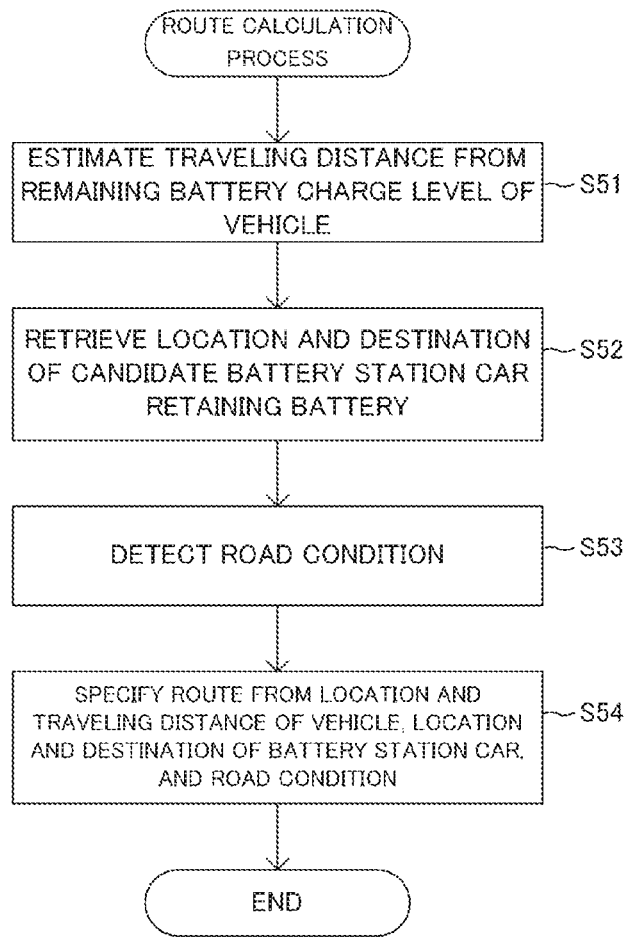
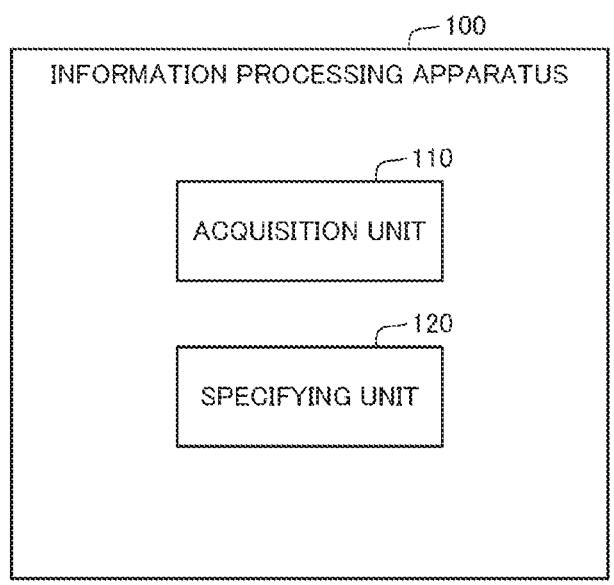

INFORMATION PROCESSING APPARATUS

INCORPORATION BY REFERENCE

This application is based upon and claims the benefit of priority from Japanese patent application No. 2018-031570, filed on Feb. 26, 2018, the disclosure of which is incorporated herein in its entirety by reference.

TECHNICAL FIELD

The present invention relates to an information processing apparatus, a program, and an information processing method.

BACKGROUND ART

In recent years, electric vehicles, such as electric cars, whose energy sources are electricity have prevailed. Such electric vehicles are, in addition to an electric vehicle traveling on general roads, a cart running on a predetermined site such as a golf course, a transporting vehicle for transporting baggage, a service vehicle carrying out a predetermined work while running, and so on. Some of these electric vehicles are operated by a person, and others travel autonomously.

The electric vehicle described above includes a battery that accumulates electricity, which is an energy source. When the remaining battery charge level of the battery of the electric vehicle decreases, the battery needs to be charged or replaced with a charged battery.

However, because the electric vehicle uses electric power as a power source for its own movement, the electric vehicle consumes a large amount of electric power. In addition to this, the capacity of the battery is still small and in the course of improvement. Therefore, it is important to be able to constantly grasp the place of a battery station where the battery can be charged or replaced and reach the battery station.

Patent Document 1 discloses a method for reserving battery replacement at a battery station by an electric vehicle. In this method, when the remaining battery charge level becomes equal to or less than a reference value, inquiry and reservation of battery replacement is made to a near battery station.

Patent Document 1: Japanese Unexamined Patent Application Publication No. JP-A 2014-003803

However, in the method according to Patent Document 1 described above, a problem of battery exhaustion occurs. The reason is that in the above method, reservation of battery replacement is made when the remaining battery charge level becomes equal to or less than the reference value and therefore there is a case where the remaining battery charge level is not sufficient for the electric vehicle to travel to the battery station where the reservation has been made. Moreover, such a problem of battery exhaustion may occur in any electric vehicle described above.

SUMMARY OF THE INVENTION

Accordingly, an object of the present invention is to provide an information processing apparatus, a program, and an information processing method which enable solution of the problem described above, namely, occurrence of battery exhaustion in an electric vehicle.

An information processing apparatus as an aspect of the present invention includes: an acquisition unit configured to acquire location information of an electric vehicle equipped with a removable and replaceable battery, and acquire a status of the battery installed in the electric vehicle; and a specifying unit configured to specify a place where two or more electric vehicles can meet, on a basis of the location information of each of the electric vehicles and the status of the battery.

Further, a non-transitory computer-readable medium storing a program as an aspect of the present invention includes instructions for causing an information processing apparatus to realize: an acquisition unit configured to acquire location information of an electric vehicle equipped with a removable and replaceable battery, and acquire a status of the battery installed in the electric vehicle; and a specifying unit configured to specify a place where two or more electric vehicles can meet, on a basis of the location information of each of the electric vehicles and the status of the battery.

Further, an information processing method as an aspect of the present invention includes: acquiring location information of an electric vehicle equipped with a removable and replaceable battery, and acquiring a status of the battery installed in the electric vehicle; and specifying a place where two or more electric vehicles can meet, on a basis of the location information of each of the electric vehicles and the status of the battery.

According to the present invention with the configurations as described above, it is possible to inhibit occurrence of battery exhaustion in an electric vehicle.

BRIEF DESCRIPTION OF DRAWINGS

FIG. 8 is a flowchart showing part of the operation of a management server disclosed in FIG. 5; and FIG. 9 is a block diagram showing the configuration of an information processing apparatus according to a third example embodiment of the present invention.

EXAMPLE EMBODIMENT

First Example Embodiment

Figure 1:
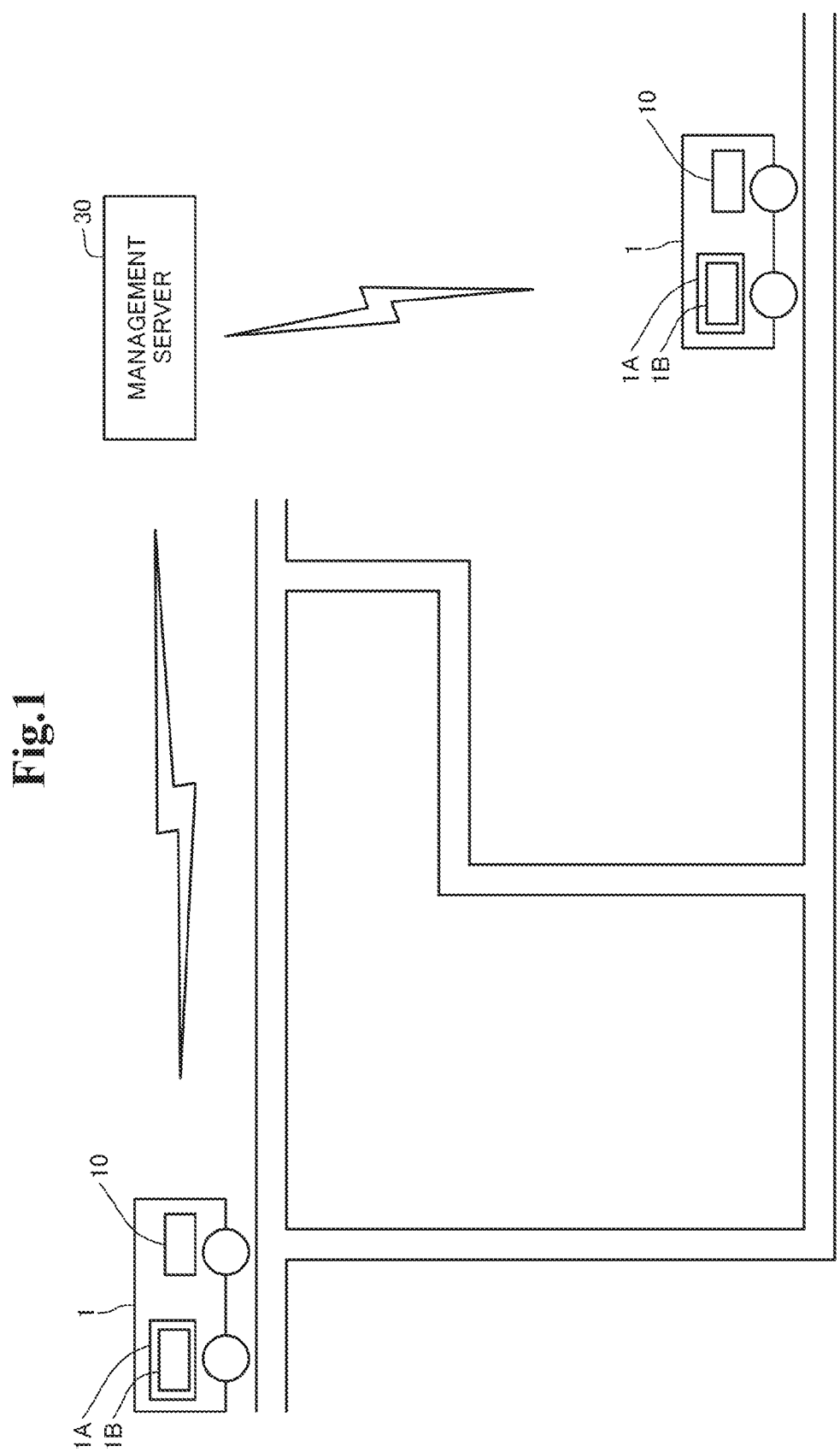
FIG. 1 is a schematic diagram showing the overall configuration of an information processing system according to a first example embodiment of the present invention.
Figure 2:
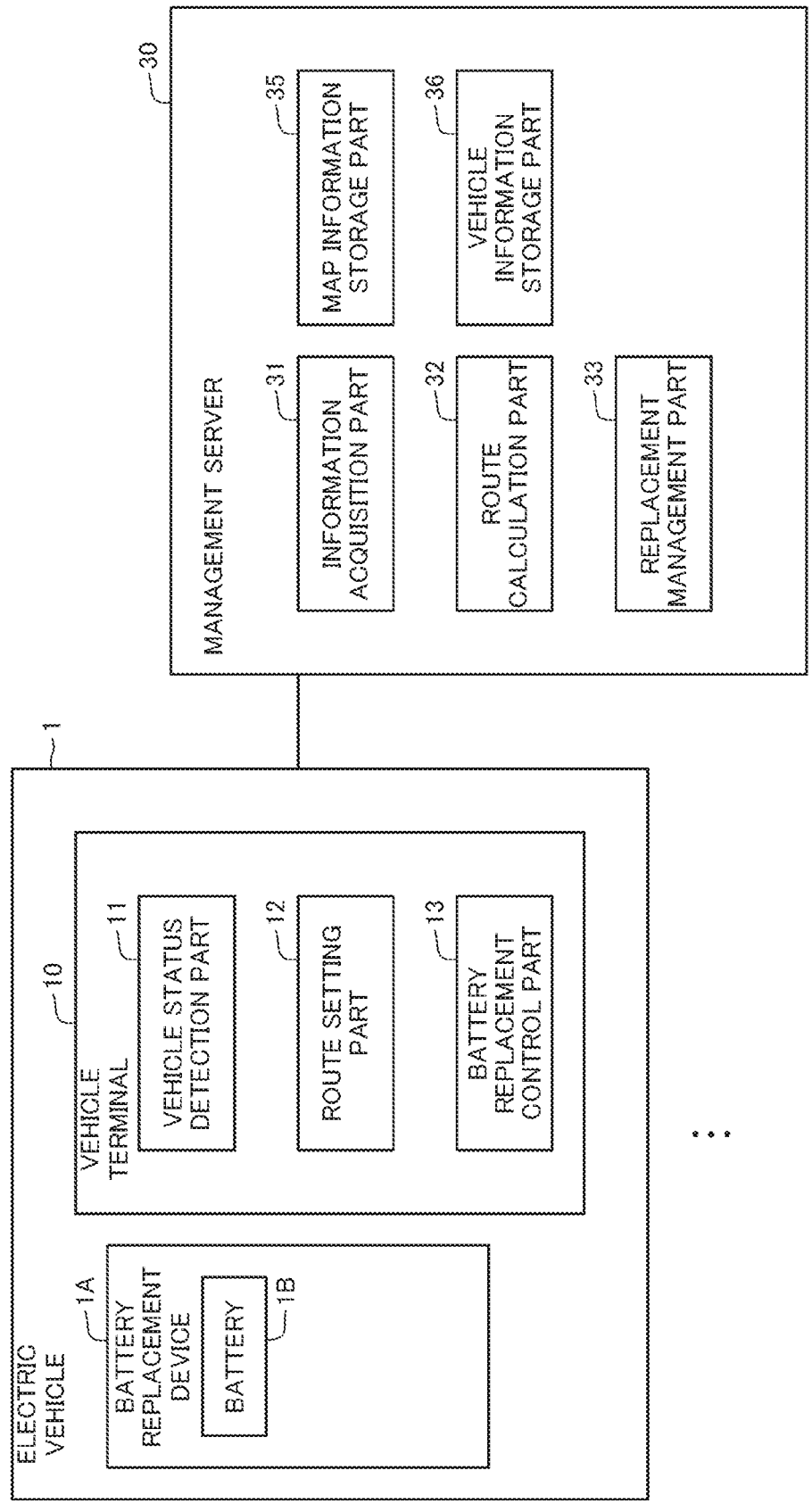
FIG. 2 is a block diagram showing the configuration of the information processing system disclosed in FIG. 1.
Figure 3:
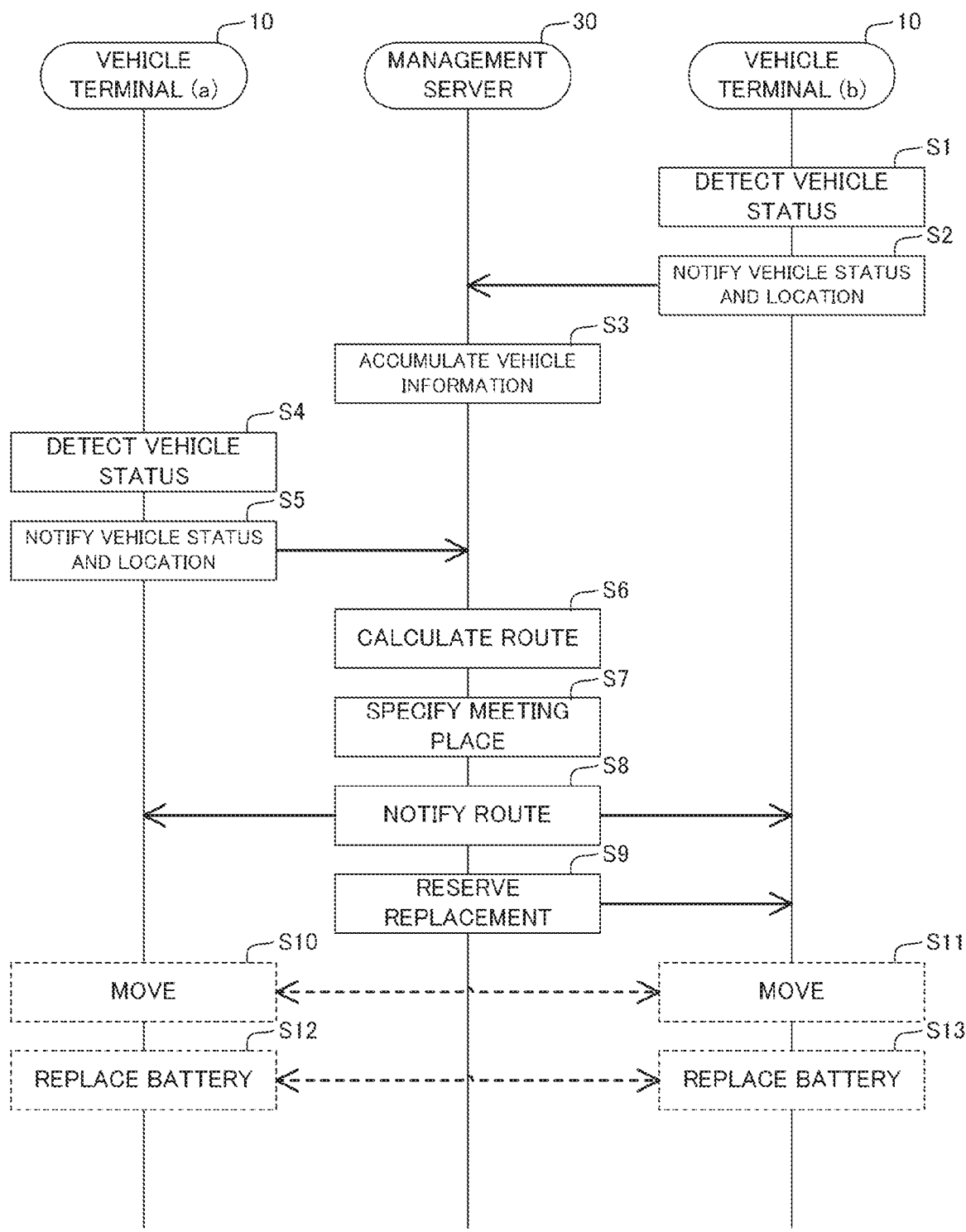
FIG. 3 is a sequence diagram showing the operation of the information processing system disclosed in FIG. 1.
Figure 4:
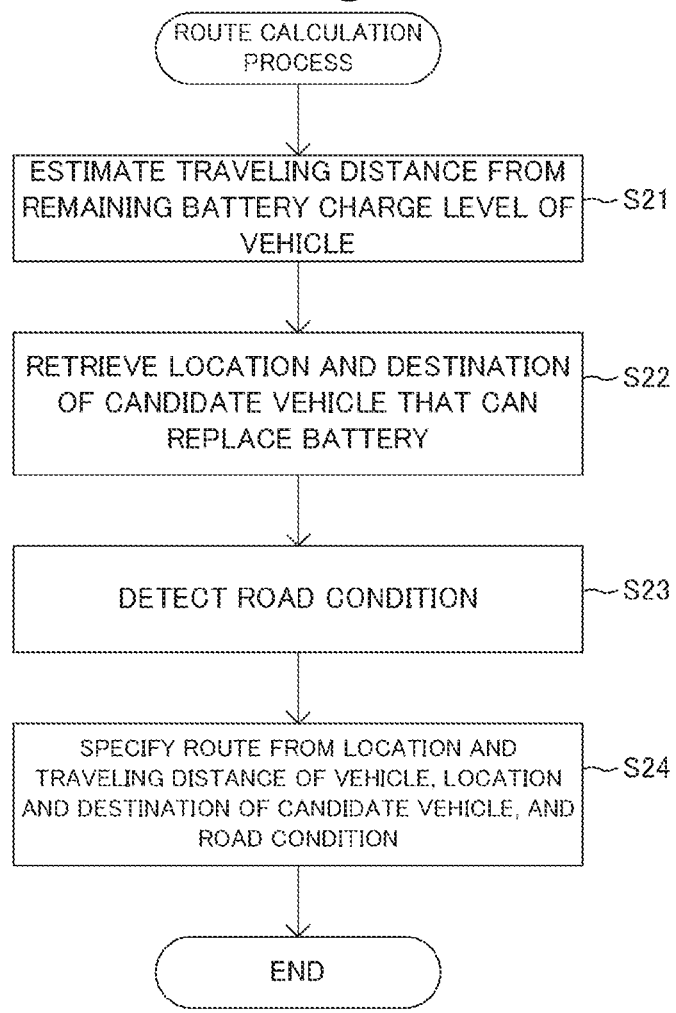
FIG. 4 is a flowchart showing part of the operation of a management server disclosed in FIG. 1.

A first example embodiment of the present invention will be described with reference to FIGS. 1 to 4. FIGS. 1 and 2 are diagrams showing the configuration of an information processing system. FIGS. 3 and 4 are diagrams showing the operation of the information processing system.

[Configuration]

The information processing system according to the present invention is to support replacement of a battery of an electric vehicle 1 whose energy source is electricity. As shown in FIG. 1, the information processing system includes a vehicle terminal 10 installed in the electric vehicle 1, and a management server 30. The vehicle terminal 10 and the management server 30 are connected via a network. Each component will be described in detail below.

In this example embodiment, it is assumed that the electric vehicle 1 is an autonomous vehicle that autonomously travels to carry packages or provide security at a predetermined place such as a factory, for example. Therefore, the electric vehicle 1 includes an autonomous traveling device (not shown). The electric vehicle 1 may be an autonomous vehicle that travels on a preset route, or may be an autonomous vehicle that freely decides a traveling route and travels. However, the electric vehicle 1 of the present invention is not limited to being an autonomous vehicle, and may be a cart operated by a person and traveling on a predetermined site or an electric car traveling on general roads. In this example embodiment, it is assumed that a plurality of electric vehicles 1 are traveling.

As shown in FIGS. 1 and 2, the electric vehicle 1 includes a battery 1B as a driving source. The battery 1B is chargeable, and the electric vehicle 1 is provided with a connector to which a charger is connected. Moreover, the electric vehicle 1 includes a battery replacement device 1A that automatically performs battery replacement for the other electric vehicle 1. Therefore, the battery 1B can be attached to and detached from the electric vehicle 1 via the battery replacement device 1A. Meanwhile, the electric vehicle 1 may not include the battery replacement device 1A that automatically performs battery replacement, and battery replacement may be performed by an operator. The number of the batteries 1B included in the electric vehicle 1 may be one or plural.

Further, the electric vehicle 1 includes the vehicle terminal 10 as shown in FIG. 2. The vehicle terminal 10 is an information processing terminal equipped with an arithmetic device and a storage device and is able to communicate with an external information processing apparatus by wireless communication. The vehicle terminal 10 includes a vehicle status detection part 11, a route setting part 12, and a battery replacement control part 13 which are constructed by the arithmetic device executing a program.

The vehicle status detection part 11 (an acquisition unit) acquires vehicle status information (a vehicle status) representing the vehicle status of the electric vehicle 1 via various sensors installed in the electric vehicle 1. For example, the vehicle status detection part 11 acquires battery information such as remaining battery charge level information representing the remaining battery charge level of the onboard battery, battery deterioration information representing the deterioration status of the battery, and the type of the battery. The vehicle status detection part 11 may also acquire other information about the battery 1B as the battery information. Upon receiving notification from the battery replacement control part 13 to be described later, the vehicle status detection part 11 notifies the management server of the battery 1B reserved for replacement with the battery of the other electric vehicle 1.

Further, the vehicle status detection part 11 may acquire information representing the status of anything other than the battery, such as the weight of the electric vehicle 1, the operation status of an air conditioner and the condition of equipment parts such as tires, as the vehicle status information. However, the vehicle status information acquired by the vehicle status detection part 11 is not limited to the information described above, and may be any information. Moreover, the vehicle status detection part 11 also detects current location information of the electric vehicle 1 as the vehicle status information, and further detects location information of a movement destination that is the destination of the electric vehicle 1, as the vehicle status information.

The vehicle status detection part 11 notifies the management server 30 via the network of the vehicle status information including the battery information and the location information acquired as described above together with identification information of the electric vehicle 1. At this time, the vehicle status detection part 11 may regularly detect the vehicle status information described above and notify the management server 30, or may notify the management server 30 of the vehicle status information at a timing when the remaining battery charge level of the battery 1B becomes equal to or less than a preset threshold value. For example, the electric vehicle 1 that can provide the battery, namely, that is set so as to be able to provide the other electric vehicle 1 with the battery 1B notifies the management server 30 of the regularly acquired vehicle status information. On the other hand, in a case where a travelable distance of the electric vehicle 1 gets short, for example, the remaining battery charge level becomes about a quarter of the full charge level, the electric vehicle 1 requests battery replacement and also notifies the management server 30 of the vehicle status information. At this time, in a case where the electric vehicle 1 includes a plurality of batteries 1B, the vehicle status detecting part 11 notifies the management server 30 at a timing when the remaining battery charge level of any one of the batteries 1B or the remaining battery charge level of all the batteries 1B becomes equal to or less than the threshold value. As with the management server 30 to be described later, the vehicle status detection part 11 may predict a travelable distance from the remaining battery charge level and, at a timing when the predicted distance becomes equal to or less than a preset threshold value, notify the management server 30 of vehicle information including the battery information. However, the vehicle status detection part 11 may notify the management server 30 of the vehicle status information including the battery information and the location information at any timing.

The route setting part 12 (a control unit), as will be described later, acquires route information representing a route up to a place to meet the other electric vehicle 1 as a destination, transmitted from the management server 30. Then, the route setting part 12 sets the acquired route information to the onboard autonomous traveling device, and controls to autonomously travel according to the route information. In a case where the electric vehicle 1 is a vehicle which does not autonomously travel and is operated by a person to travel, the route setting part 12 performs processing to set the acquired route information to a navigation system or output the acquired route information to present to the driver.

The above-described battery replacement control part 13 (a control unit) receives the battery replacement information sent from the management server 30 as described later. The battery replacement information includes, for example, the identification information of the other electric vehicle 1 scheduled to meet at the meeting place and replace the battery later and the number and type of the battery 1B scheduled to be replaced. Then, the battery replacement control part 13 specifies the battery 1B scheduled to be replaced, and notifies the vehicle status detection part 11 that the battery 1B has been reserved.

Further, the battery replacement control part 13 controls the operation of the battery replacement device 1A so that the battery replacement device 1A stops at a designated location of the other electric vehicle 1 and replaces the battery with that of the other electric vehicle 1. When an operator replaces the battery, the battery replacement control part 13 may perform processing to notify the operator of the received battery replacement information.

The management server 30 (an information processing apparatus) is an information processing apparatus including an arithmetic device and a storage device, and is capable of communicating with an external information processing apparatus via the network. As shown in FIG. 2, the management server 30 includes an information acquisition part 31, a route calculation part 32, and a replacement management part 33, which are constructed by the arithmetic device executing a program. In addition, the management server 30 includes a map information storage part 35 and a station information storage part 36, which are formed in the storage device.

In the map information storage part 35, map information within a movement range of the electric vehicle 1 is stored. In particular, the map information includes information about roads on which the electric vehicle 1 can run. For example, road information included in the map information includes various road conditions such as the inclination and width of the roads, construction situations and congestion situations. Here, the road conditions may be a statistical value such as a congestion situation of a road measured in the past, or may be a current road condition measured at another place.

In the vehicle information storage part 36, information of each electric vehicle 1 is stored. The information of the electric vehicle 1 is the vehicle status information sent from each electric vehicle 1 as described above, more specifically, is the vehicle status information sent from the electric vehicle 1 that can provide the battery. For example, in the vehicle information storage part 36, the above-described battery information, current location information of the electric vehicle 1, and location information of a movement destination that is the destination of the electric vehicle 1 are stored in association with the identification information of the electric vehicle 1.

Upon receiving the vehicle status information sent regularly or at any timing from the electric vehicle 1 that can provide the battery, the information acquisition part 31 (an acquisition unit) updates the information of the electric vehicle 1 in the vehicle information storage part 36 and stores the information. Specifically, the information acquisition part 31 specifies the vehicle status information in the vehicle information storage part 36 corresponding to the identification information of the electric vehicle 1 sent together with the vehicle status information, and updates the vehicle status information to the received information. As a result, in the vehicle information storage part 36 of the management server 30, the latest information of the battery 1B installed in the electric vehicle 1 is stored together with the location information of each battery station 2.

Further, when receiving vehicle status information sent in a situation such as at a timing when the remaining battery charge level becomes equal to or less than a preset threshold value from the electric vehicle 1 as described above, the information acquisition part 31 receives the vehicle status information as information for requesting replacement of the onboard battery 1B. Thus, the information acquisition part 31 notifies the route calculation part 32 of the received identification information of the electric vehicle 1 and the received vehicle status information including the battery information and the location information.

Based on the vehicle status information received from the electric vehicle 1 as described above and the information of each electric vehicle 1 stored in the vehicle information storage part 36, the route calculation part 32 (a specifying unit) selects the electric vehicles that replace the batteries with each other and specifies a place where the selected electric vehicles 1 can meet. To be specific, the route calculation part 32 first calculates a distance that the electric vehicle 1 can travel in the normal state, based on the remaining battery charge level information and battery deterioration information included in the vehicle status information received from the electric vehicle 1 requesting battery replacement. For example, the route calculation part 32 calculates a distance that the electric vehicle 1 can travel from the actual remaining battery charge level based on correspondence information between a remaining battery charge level and a traveling distance set in advance, and additionally performs a process such as discounting a distance calculated in consideration of the deterioration condition of the battery, thereby calculating a travelable distance. Moreover, the route calculation part 32 calculates the travelable distance also based on the vehicle status information other than the battery information, such as the weight of the electric vehicle 1 and the operating condition of the air conditioner. For example, the route calculation part 32 performs a process such as discounting more travelable distance as the weight of the electric vehicle 1 is heavier or discounting the travelable distance in a situation where the air conditioner is operating.

Further, the route calculation part 32 retrieves the vehicle status information of the electric vehicle 1 stored in the vehicle information storage part 36, that is, the vehicle status information of the electric vehicle 1 that can provide the battery, namely, that is set to be able to provide the other electric vehicle 1 with the battery 1. At this time, the route calculation part 32 retrieves, for example, vehicle status information of the electric vehicle 1 equipped with a battery whose remaining battery charge level is almost full and equal to or more than a reference value and which is a type that can be installed in the electric vehicle 1 requesting battery replacement.

Then, with the use of the map information stored in the map information storage part 35, the route calculation part 32 specifies a place where the electric vehicle 1 requesting battery replacement meets the electric vehicle 1 capable of battery provision. To be specific, based on a travelable distance and current location information of the electric vehicle 1 requesting battery replacement and on current location information of the electric vehicle 1 capable of battery provision and location information of its movement destination, the route calculation part 32 specifies a candidate of a meeting place where the electric vehicles 1 can meet, and moreover, calculates candidates of routes from the respective electric vehicles 1 to the meeting place. Therefore, in this example embodiment, the electric vehicle 1 capable of battery provision may specify the meeting place so as to get close to the current location of the electric vehicle 1 requesting battery replacement, or may specify the meeting place on a route to a movement destination that is a destination of the electric vehicle 1 capable of battery provision.

As an example, in a case where the remaining battery charge level of the electric vehicle 1 requesting battery replacement is extremely low, the route calculation part 32 specifies the vicinity of the current location of this electric vehicle 1 as a meeting place. As another example, in a case where a predetermined location on a route up to a movement destination of the electric vehicle 1 capable of battery provision is near a current location of the electric vehicle 1 requesting battery replacement, the route calculation part 32 specifies the predetermined location on the route up to the movement destination of the electric vehicle 1 capable of battery provision as a meeting place. Then, the route calculation part 32 specifies routes from the respective current locations of the electric vehicles 1 up to the specified meeting place, and notifies the replacement management part 33 of the specified routes. Meanwhile, the route calculation part 32 may specify places and routes to meet a plurality of electric vehicles 1 capable of battery provision, with respect to the electric vehicle 1 requesting battery replacement. Moreover, at the time of calculating a candidate route, the route calculation part 32 may consider the inclination and congestion status of a road on the route. For example, the route calculation part 32 determines to, in a case where the road is uphill, set a travelable distance short because battery consumption is large, or determines to, in a case where the road is heavily congested and the distance is long, avoid such a route, and calculates a candidate route. Besides, the route calculation part 32 may calculate a route candidate based on information such as a congestion status, a construction status, a road width, and the number of pedestrians.

The replacement management part 33 (a control unit) notifies the respective electric vehicles 1 of information about the routes from the respective electric vehicles 1 up to the meeting place specified in the above-described manner. Consequently, the respective electric vehicles 1 set the notified route information to the onboard autonomous traveling devices and travel autonomously. Thus, the replacement management part 33 executes control so that the respective electric vehicles 1 autonomously travel to the specified meeting place. Meanwhile, in a case where the electric vehicle 1 is not an autonomous vehicle, the route information is merely notified to this electric vehicle 1, but the route information is thereafter set to the navigation system or outputted so as to be presented to the driver in the electric vehicle 1.

Further, the replacement management part 33 notifies the electric vehicle 1 capable of battery provision, of battery replacement information. At this time, the replacement management part 33 notifies the electric vehicle 1 capable of battery provision of, as battery replacement information, identification information of the electric vehicle 1 requesting battery replacement and the number and type of a battery scheduled to be replaced with the battery of the requesting electric vehicle 1, and reserves the battery for replacement at the electric vehicle 1 capable of battery provision.

Every time vehicle status information is received from each electric vehicle 1, the information acquisition part 31, the route calculation part 32, and the replacement management part 33 of the management server 30 described above may perform the above-described processing to specify a meeting place and specify a route. Also, every time map information in the map information storage part 35 is updated, the information acquisition part 31, the route calculation part 32, and the replacement management part 33 may perform the processing to specify a meeting place and a route.

Further, the information acquisition part 31, the route calculation part 32, and the replacement management part 33 of the management server 30 described above may be installed in the vehicle terminal 10 mounted on each electric vehicle 1. That is, the above-described processing to specify a meeting place and specify a route may be performed by the vehicle terminal 10.

[Operation]

Next, the operation of the above information processing system will be described mainly with reference to the sequence diagram of FIG. 3 and the flowchart of FIG. 4. In FIG. 3, a vehicle terminal installed in the electric vehicle 1 requesting battery replacement is denoted as a vehicle terminal (a), and a vehicle terminal installed in the electric vehicle 1 capable of battery provision is denoted as a vehicle terminal (b). The operation described below is merely an example, the information processing system is not necessarily limited to operating in a manner described below, and each device may operate in the above-described manner.

First, the vehicle terminal (b) 10 of the electric vehicle 1 capable of battery provision detects and acquires vehicle status information including battery information such as the number, type and battery charge level of the onboard batteries 1B with the use of various onboard sensors at regular and constant time intervals (step S1). Then, the vehicle terminal (b) 10 notifies the management server 30 of the detected vehicle status information (step S2). At this time, the vehicle terminal (b) 10 includes current location information of its own electric vehicle 1 and location information of a movement destination in the vehicle status information, and notifies the management server 30.

The management server 30 specifies vehicle status information in the vehicle information storage part 36 associated with identification information of the electric vehicle 1 received together with the vehicle status information, and updates the vehicle status information to the received information and stores it (step S3). Consequently, in the management server 30, the latest information such as the battery status and location of the electric vehicle 1 capable of battery provision is stored.

Further, the vehicle terminal (a) 10 of the electric vehicle 1 that is to request battery replacement detects vehicle status information including battery information and location information with the use of various onboard sensors at constant time intervals (step S4). When the remaining battery charge level gets lower than a reference value, the electric vehicle 1 notifies the management server 30 of the detected vehicle status information and requests battery replacement (step S5).

Upon receiving the vehicle status information from the electric vehicle 1 requesting battery replacement, the management server 30 first calculates a distance that the electric vehicle 1 can travel in a normal state, based on remaining battery charge level information and so on included in the received vehicle status information. Then, with the use of map information, the management server 30 calculates candidates of a meeting place where the electric vehicle 1 requesting battery replacement meets the electric vehicle 1 capable of battery provision and candidates of routes to the meeting place, based on the calculated travelable distance, current location information of the electric vehicle 1 requesting battery replacement, current location information of the electric vehicle 1 capable of battery provision, and location information of a movement destination of the electric vehicle 1 capable of battery provision (step S6). Moreover, the management server 30 specifies the meeting place and the routes from among the candidates of the meeting place and the candidates of the routes in consideration of a distance, a road condition, and so on (step S7).

To be specific, the above-described processing to specify the meeting place and the routes by the management server 30 is performed in the following manner as shown in the flowchart of FIG. 4. First, based on the remaining battery charge level information and battery deterioration information that are included in the vehicle status information received from the electric vehicle 1 requesting battery replacement, the management server 30 calculates the distance that the electric vehicle 1 can travel in the normal state (step S21). At this time, the management server 30 calculates the travelable distance based on not only the remaining battery charge level but also the vehicle status information other than the battery information, such as the weight of the electric vehicle 1.

Then, the management server 30 retrieves the current location information and movement destination location information of the electric vehicle 1 capable of battery provision retaining the battery 1B replaceable for the electric vehicle 1 requesting battery replacement, from stored information of each electric vehicle 1 capable of battery provision (step 22). Moreover, the management server 30 also detects the inclination and congestion status of the road (step S23).

Then, with the use of the map information, the management server 30 calculates the place where the electric vehicles 1 can meet and the routes thereto, based on the calculated distance that the electric vehicle 1 requesting battery replacement can travel, the current location information of this electric vehicle 1, and the current location information and movement destination location information of the electric vehicle 1 capable of battery provision. Besides, also in consideration of the inclination and congestion status of the roads on the routes, the management server 30 specifies the meeting place at which the electric vehicle 1 requesting battery replacement can arrive, and specifies the route from the electric vehicle 1 requesting battery replacement to the meeting place and the route from the electric vehicle 1 capable of providing the battery to the meeting place (step S24).

Subsequently, the management server 30 notifies the electric vehicle 1 requesting battery replacement of the specified route from the electric vehicle 1 requesting battery replacement to the meeting place and the information about the electric vehicle 1 capable of battery provision that is scheduled to meet (step S8). Also, the management server 30 notifies the electric vehicle 1 capable of battery provision of the specified route from the electric vehicle 1 capable of battery provision to the meeting place and the information about the electric vehicle 1 requesting battery replacement that is scheduled to meet (step S8). At the same time, the management server 30 notifies the electric vehicle 1 capable of battery provision of the number and type of the battery scheduled to be replaced, and reserves battery replacement (step S9).

After that, the electric vehicle 1 requesting battery replacement and the electric vehicle 1 capable of battery provision set the route information notified by the management server 30 to the respective autonomous traveling devices, and move to the meeting place by autonomous traveling (steps S10 and S11). When reaching the meeting place, the electric vehicle 1 requesting battery replacement stops at a designated location of the electric vehicle 1 capable of battery provision by an autonomous traveling function. Then, the battery replacement device 1A of the electric vehicle 1 capable of battery provision automatically replaces the battery of the electric vehicle 1 requesting battery replacement (steps S12 and S13).

As described above, according to the information processing system of this example embodiment, in consideration of a battery status such as the remaining battery charge level of the electric vehicle 1, the electric vehicle 1 specifies a route up to a place to meet the other electric vehicle 1 capable of battery provision. Therefore, the electric vehicle 1 can realize battery replacement with another electric vehicle without running out of battery.

Second Example Embodiment

Figure 5:
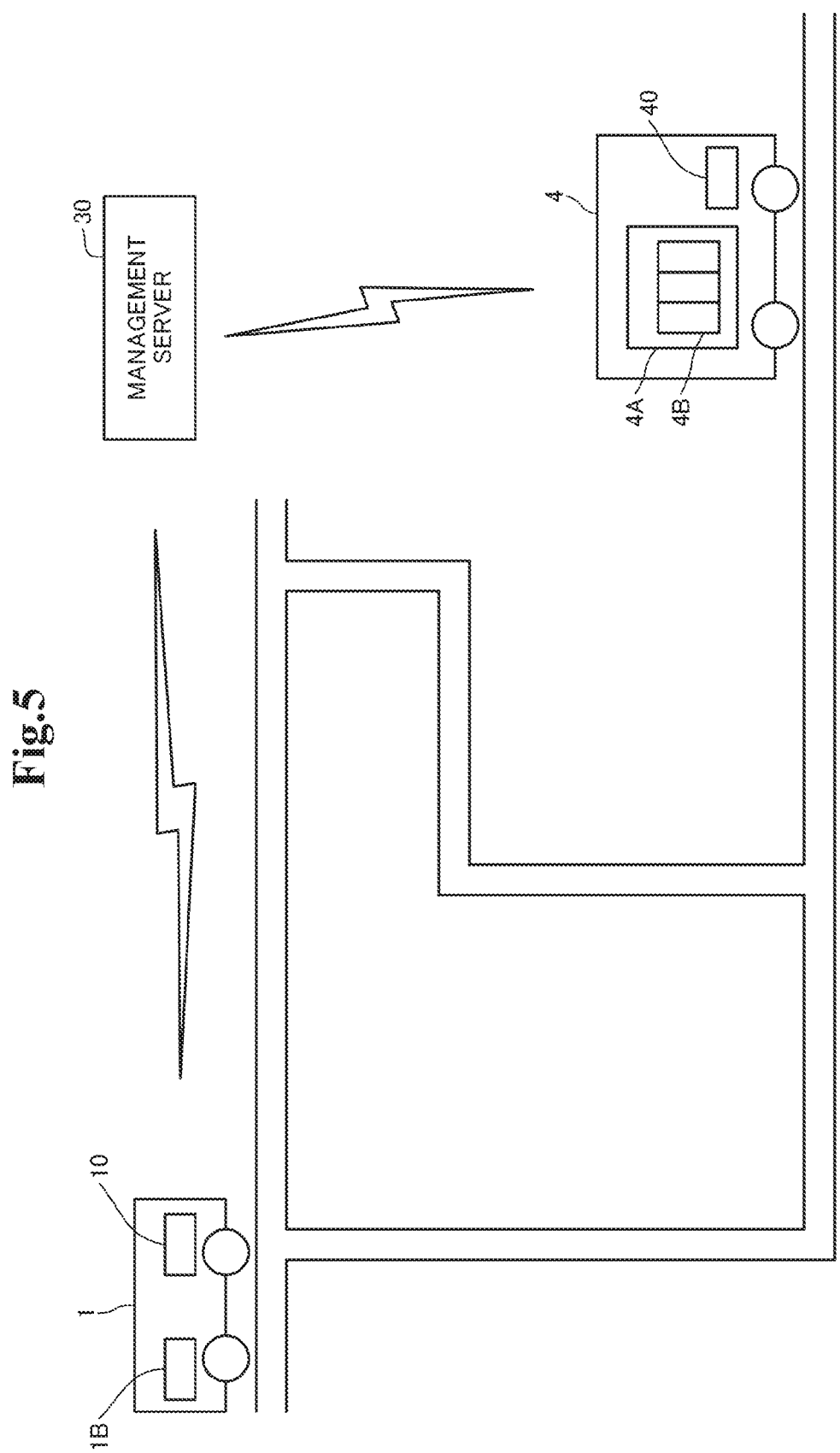
FIG. 5 is a schematic diagram showing the overall configuration of an information processing system according to a second example embodiment of the present invention.
Figure 6:
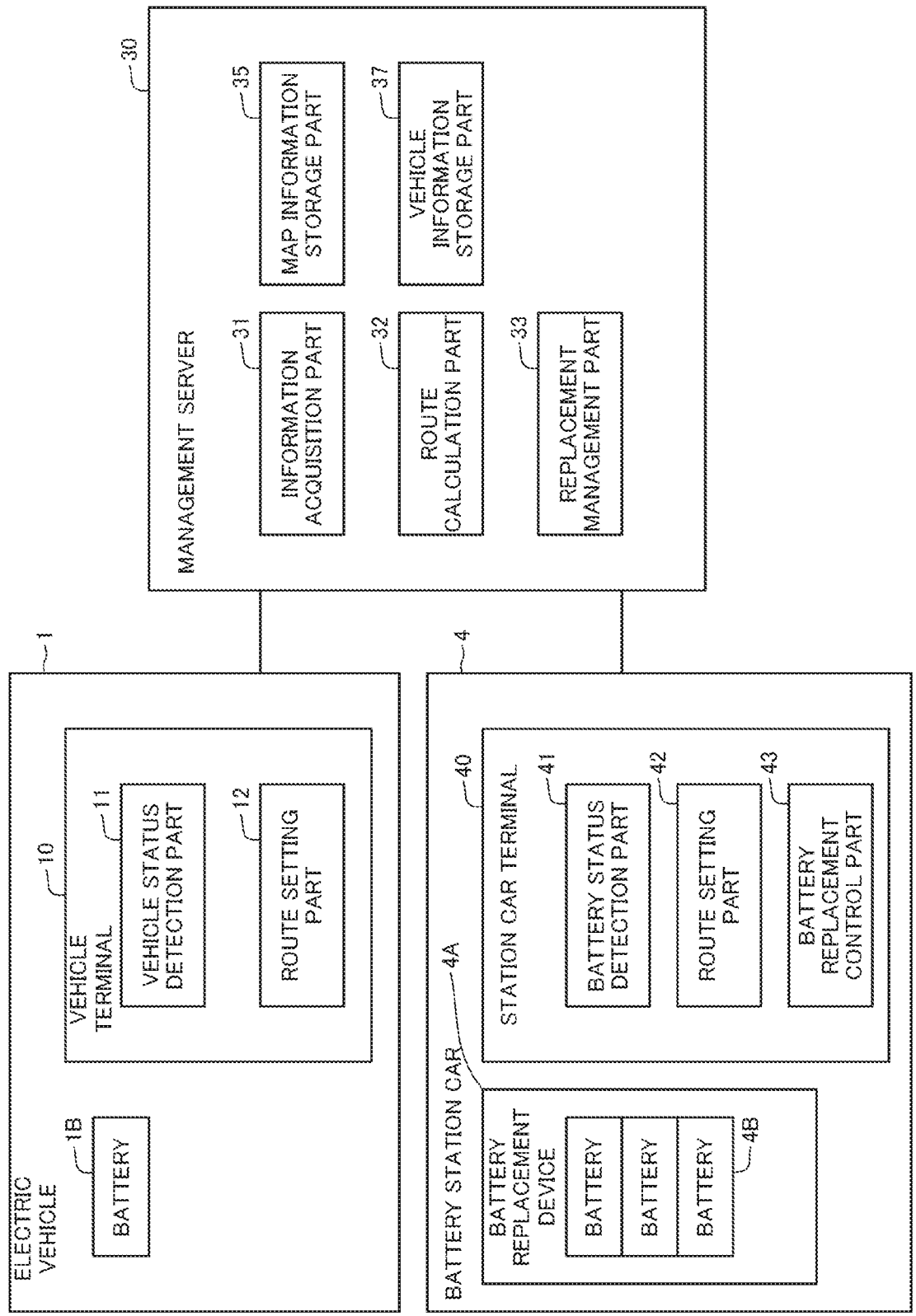
FIG. 6 is a block diagram showing the configuration of the information processing system disclosed in FIG. 5.
Figure 7:
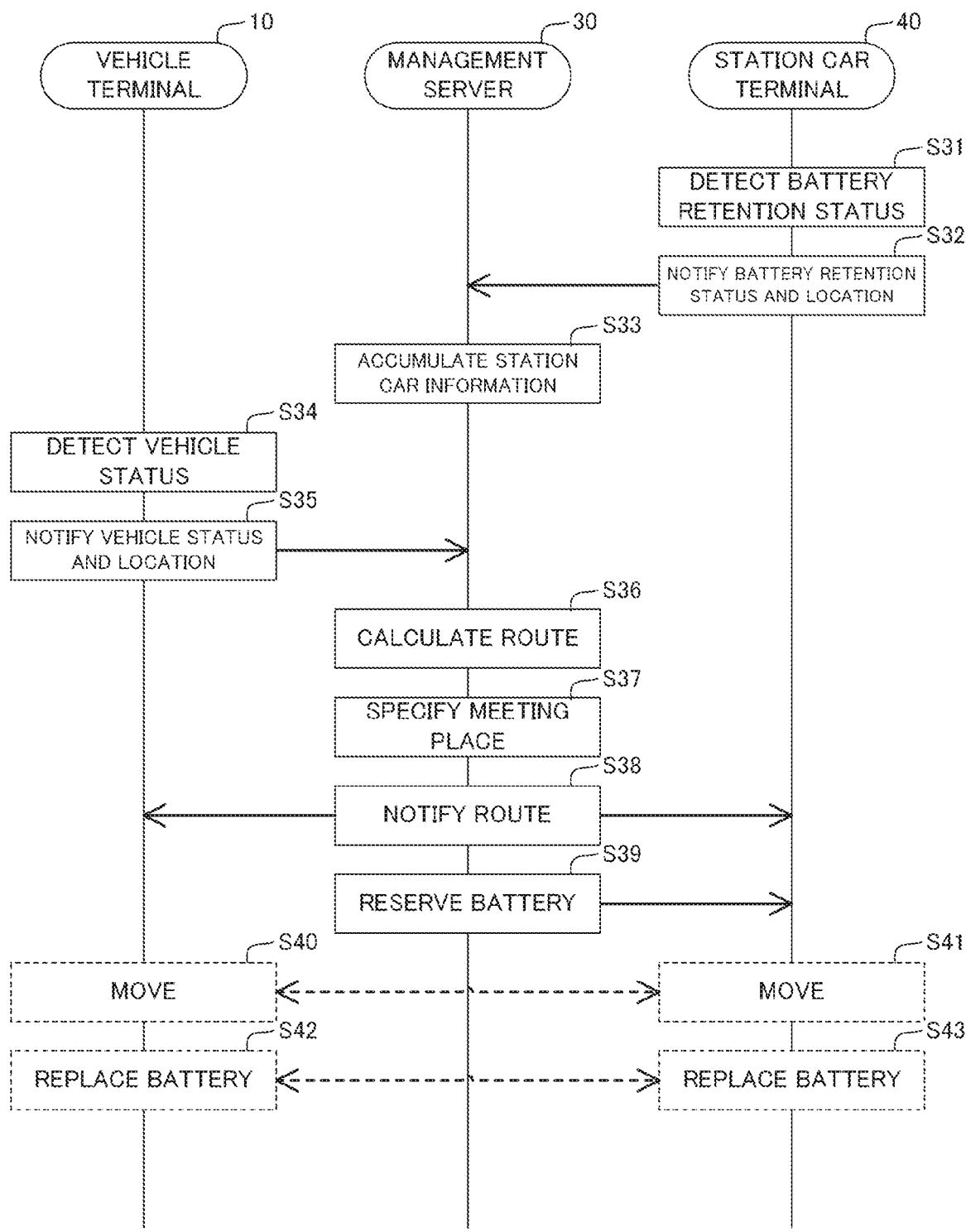
FIG. 7 is a sequence diagram showing the operation of the information processing system disclosed in FIG. 5.

Next, a second example embodiment of the present invention will be described with reference to FIGS. 5 to 8. FIGS. 5 to 6 are diagrams showing the configuration of an information processing system. FIGS. 7 to 8 are diagrams showing the operation of the information processing system.

[Configuration]

The information processing system according to the present invention is substantially the same in configuration as that of the first example embodiment described above, but is different in that the electric vehicle 1 capable of battery provision described in the first example embodiment is configured by a battery station car 4 (a battery replacement place), which is a moving vehicle equipped with a battery 4B for replacement. Hereinafter, components that are different from those of the first example embodiment will mainly be described.

First, the electric vehicle 1 in this example embodiment is the electric vehicle requesting battery replacement described in the first example embodiment, and has almost the same configuration as that of the first example embodiment. Therefore, a description of the configuration of the electric vehicle 1 will be omitted.

It is assumed that the battery station car 4 in this example embodiment is an autonomous vehicle that autonomously travels within a predetermined place such as a factory, for example. Therefore, the battery station car 4 includes an autonomous traveling device (not shown). However, the battery station car 4 is not limited to being an autonomous vehicle, and may be a vehicle which is operated by a person to travel.

The battery station car 4 has a function to replace the battery 1B of the electric vehicle 1, and one or more battery station cars are traveling. In this example embodiment, the battery station car 4 replaces a battery of the electric vehicle 1 by replacing the battery of the electric vehicle 1, that is, by detaching the battery with low battery charge level from the electric vehicle 1 and attaching another battery that is sufficiently charged. Therefore, the battery station car 4 is equipped with the battery 4B to be replaced and mounted on the electric vehicle 1.

Further, as shown in FIGS. 5 and 6, the battery station car 4 is equipped with a battery replacement device 4A that automatically replaces the battery of the electric vehicle 1. The battery replacement device 4A retains a plurality of batteries 4B stocked in the battery station car 4 in an attachable and detachable manner while charging the batteries, and operates so as to remove the battery 1B installed in the electric vehicle 1 stopped at a designated location of the battery station car 4 and install the retained battery 4B into the electric vehicle 1. Meanwhile, the battery station car 4 may not include the battery replacement device 4A that automatically performs battery replacement, and battery replacement may be performed by an operator.

Meanwhile, the battery station car 4 is not necessarily limited to replacing the battery of the electric vehicle 1, and may have a charger which charges a battery. Consequently, by connecting the charger to a connector of the electric vehicle 1, the battery station car 4 may replace the battery 1B installed in the electric vehicle 1.

Further, as shown in FIG. 6, the battery station car 4 includes a station car terminal 40. The station car terminal 40 is an information processing terminal including an arithmetic device and a storage device, and is able to communicate with an external information processing apparatus via a network. The station car terminal 40 includes a battery status detection part 41, a route setting part 42, and a battery replacement control part 43, which are constructed by the arithmetic device executing a program.

The battery status detection part 41 is connected to the battery replacement device 4A and acquires the status of the battery 4B from the battery replacement device 4A. For example, the battery status detection part 41 acquires battery information such as the number, type and battery charge level of the onboard batteries 4B charged by the battery replacement device 4A. However, the battery status detection part 41 may acquire other information about the batteries 4B installed in the battery replacement device 4A as the battery information.

Based on the acquired battery information, the battery status detection part 41 notifies the management server 30 of battery retention information, which is information on the replaceable batteries 4B of the batteries 4B installed in the battery replacement device 4A. For example, the battery status detection part 41 notifies the management server 30 of, as the battery retention information, the number and type of the fully charged batteries 4B from the acquired battery information, together with identification information of the battery station car 4. At this time, upon receiving notification from the battery replacement control part 43 to be described later, the battery status detection part 41 notifies the management server 30 of the battery retention information except the battery 4B for which replacement with the battery 1B of any electric vehicle 1 is reserved. However, regarding the reserved battery 4B, the battery status detection part 41 may notify the management server 30 together with information showing that the battery 4B has already been reserved (a flag).

The battery status detection part 41 regularly acquires the above-described battery information and notifies the management server 30 of the battery retention information. However, the battery status detection part 41 may notify the management server 30 of the battery retention information when a certain change occurs in the battery information acquired at any timing. Moreover, the battery status detection part 41 may acquire battery retention information, which is information of the replaceable battery 4B stocked in the battery station car 4, via an input by the operator of the battery station car 4.

Further, the battery status detection part 41 detects current location information of the battery station car 4 and location information of a movement destination to which the battery station car 4 is scheduled to move. Then, the battery status detection part 41 notifies the management server 30 of the current location information and the location information of the movement destination.

The route setting part 42 (a control unit) acquires route information representing a route up to a place to meet the electric vehicle 1, sent by the management server 30 as described later. The route setting part 42 sets the acquired route information to an autonomous traveling device mounted thereon and controls so as to autonomously travel in accordance with the route information. In a case where the battery station car 4 is a vehicle which does not autonomously travel and is operated by a person to travel, the route setting part 42 performs a process such as setting the acquired route information to a navigation system and outputting so as to present to the driver.

The battery replacement control part 43 (the control unit) receives battery replacement information sent from the management server 30 as described later. The battery replacement information includes, for example, identification information of the electric vehicle 1 scheduled to come to the battery station car 4 to replace the battery later and the number and type of the battery 4B to be replaced with the battery of the electric vehicle 1. Then, the battery replacement control part 43 specifies the battery 4B to be replaced and notifies the battery status detection part 41 that the battery 4B is reserved.

Further, the battery replacement control part 43 controls the operation of the battery replacement device 4A so that the battery replacement device 4A replaces the battery of the electric vehicle 1 stopped at a designated location of the battery station car 4. In a case where an operator replaces the battery at the battery station car 4, the battery replacement control part 43 may perform processing to notify the operator of the received battery replacement information.

As shown in FIG. 6, the management server 30 (the information processing apparatus) in this example embodiment has almost the same configuration as in the first example embodiment, but is different in the following points.

First, the management server 30 in this example embodiment includes a station information storage part 37 formed in a storage device, instead of the vehicle information storage part 36 described in the first example embodiment. In the station information storage part 37, information of each battery station car 4 is stored. The information of the battery station car 4 includes, for example, battery retention information of the battery station car 4 acquired by the information acquisition part 31 to be described later, current location information of the battery station car 4, and location information of a movement destination.

When receiving the battery retention information regularly sent from the station car terminal 40, the information acquisition part 31 (the acquisition unit) updates information of the battery station car 4 in the station information storage part 37 and stores it. At this time, the information acquisition part 31 receives the current location information of the battery station car 4 and the location information of the movement destination together with the battery retention information, and stores into the station information storage part 37. As a result, in the station information storage part 37 of the management server 30, the latest information of the replaceable battery 4B stocked in each battery station car 4 is stored in association with the current location information of the battery station car 4 and the location information of the movement destination.

Further, in the same manner as in the first example embodiment, the information acquisition part 31 receives vehicle status information sent from the electric vehicle 1. At this time, because the electric vehicle 1 sends the vehicle status information at a timing when the remaining battery charge level becomes equal to or less than a preset threshold value, the information acquisition part 31 receives the vehicle status information as information for requesting replacement of the onboard battery 4B.

Based on the vehicle status information received from the electric vehicle 1 in the above-described manner and the information of each battery station car 4 stored in the station information storage part 37, the route calculation part 32 (the specifying unit) performs processing to specify a place where the electric vehicle 1 and the battery station car 4 can meet. To be specific, in the same manner as in the first example embodiment, the route calculation part 32 calculates a distance that the electric vehicle 1 can travel in a normal state, first based on the remaining battery charge level information and battery deterioration information included in the vehicle status information received from the electric vehicle 1 and further based on other vehicle status information.

Further, with the use of map information stored in the map information storage part 35, the route calculation part 32 specifies candidates of the place where the electric vehicle 1 and the battery station car 4 can meet based on the calculated travelable distance, the current location information of the electric vehicle 1, the current location information of each battery station car 4, and the location information of the movement destination of each battery station car 4, and moreover, calculates route candidates. Therefore, in this example embodiment, the meeting place may be specified so that the battery station car 4 approaches the current location of the electric vehicle 1, or the meeting place may be specified on the route up to the movement destination that is the destination of the battery station car 4.

As an example, in a case where the remaining battery charge level of the electric vehicle 1 is extremely low, the route calculation part 32 specifies the vicinity of the current location of the electric vehicle 1 as the meeting place. As another example, when a predetermined location on the route up to the movement destination of the battery station car 4 is close to the current location of the electric vehicle 1, the route calculation part 32 specifies the predetermined location on the route up to the movement destination of the battery station car 4, as the meeting place. Then, the route calculation part 32 specifies the route from the current location of the electric vehicle 1 to the specified meeting place and the route from the current location of the battery station car 4 to the specified meeting place, and notifies the replacement management part 33 of the specified routes.

The replacement management part 33 (the control unit) notifies the electric vehicle 1 of the information about the route from the electric vehicle 1 to the meeting place specified in the above-described manner. Moreover, the replacement management part 33 notifies the battery station car 4 of the information about the route from the battery station car 4 to the meeting place specified in the above-described manner. At this time, the electric vehicle 1 and the battery station car 4 set the notified route information to the respective onboard autonomous traveling devices and start autonomously travelling. Thus, the replacement management part 33 performs control so that the electric vehicle 1 and the battery station car 4 autonomously travel to the specified meeting place.

Further, the replacement management part 33 notifies the station car terminal 40 of the battery station car 4 that the electric vehicle 1 is to meet, of the battery replacement information. At this time, the replacement management part 33 notifies the station car terminal 40 of, as the battery replacement information, the identification information of the electric vehicle 1 and the number and type of the battery 4B scheduled to be replaced with the battery of the electric vehicle 1, and reserves the battery 4B for replacement at the battery station car 4.

The information acquisition part 31, the route calculation part 32, and the replacement management part 33 of the management server 30 described above may perform the above-described processing to specify the meeting place and specify the route every time receiving vehicle status information from the electric vehicle 1. Moreover, the information acquisition part 31, the route calculation part 32, and the replacement management part 33 may perform the processing to specify the meeting place and the route each time information is acquired from the battery station car 4 or each time the map information in the map information storage part 35 is updated.

[Operation]

Next, the operation of the above-described information processing system will be described mainly with reference to the sequence diagram of FIG. 7 and the flowchart of FIG. 8. The operation described below is merely an example, the information processing system is not necessarily limited to operating in a manner described below, and each device may operate in the above-described manner.

First, the station car terminal 40 regularly detects and acquires battery information such as the number, type and battery charge level of the onboard batteries 4B charged by the battery replacement device 4A (step S31). Then, the station car terminal 40 notifies the management server 30 of battery retention information that is information about the replaceable battery 4B, current location information, and location information of a movement destination that is a destination (step S32).

The management server 30 specifies information in the station information storage part 37 corresponding to identification information of the battery station car 4 received together with the battery retention information, and updates the information to the received battery retention information and location information and stores (step S33). Consequently, in the management server 30, the latest information of the replaceable battery 4B stocked in the battery station car 4 and the latest information of the location are stored.

Further, the electric vehicle 1 detects vehicle status information including the battery information and the location information with the use of various sensors mounted thereon at constant time intervals (step S34). When the remaining battery charge level gets lower than a reference value, the electric vehicle 1 notifies the management server 30 of the detected vehicle status information (step S35).

Upon receiving the vehicle status information, the management server 30 first calculates a distance that the electric vehicle 1 can travel in the normal state, based on the remaining battery charge level information and so on included in the vehicle status information received from the electric vehicle 1. Then, with the use of the map information, the management server 30 calculates candidates of a meeting place where the electric vehicle 1 and the battery car station 4 can meet and route candidates, based on the calculated travelable distance and current location information of the electric vehicle 1 and location information of each battery station car 4 (step S36). Moreover, the management server 30 specifies the meeting place and the route from among the meeting place candidates and the route candidates in consideration of the distance, the battery retention condition of the battery station car 4, the condition of the road on the route, and so on (step S37).

To be specific, the above-described processing to specify the battery station by the management server 30 is performed in the following manner as shown in the flowchart of FIG. 8. First, the management server 30 calculates a distance that the electric vehicle 1 can travel in the normal state, based on the remaining battery charge level information and the battery deterioration information that are included in the vehicle status information received from the electric vehicle 1 (step S51). At this time, the management server 30 calculates the travelable distance based on not only the remaining battery charge level but also the vehicle status information, such as the weight of the electric vehicle 1, other than the battery information.

Then, the management server 30 retrieves current location information of the battery station car 4 retaining the battery 4B that can be replaced with the battery of the electric vehicle 1 and location information of the movement destination, from the stored information of each battery station car 4 (step S52). Moreover, the management server 30 detects road conditions such as the inclination and congestion condition of the road on the route (step S53).

Then, with the use of the map information, the management server 30 calculates a meeting place and route that enable the electric vehicle 1 and the battery station car 4 to meet, based on the calculated distance that the electric vehicle 1 can travel and the current location information of the electric vehicle 1 and the location information of each battery station car 4. Moreover, in consideration of the conditions of the road on the route, the management server 30 specifies a meeting place at which the electric vehicle 1 can arrive, and specifies a route from the electric vehicle 1 to the meeting place, and a route from the battery station car 4 to the meeting place (step S54).

Subsequently, the management server 30 notifies the electric vehicle 1 of the specified route from the electric vehicle 1 to the meeting place and the information of the battery station car 4 to meet (step S38). Moreover, the management server 30 notifies the battery station car 4 of the specified route from the battery station car 4 to the meeting place and the information of the electric vehicle 1 to meet (step S38). Besides, the management server 30 notifies the battery station car 4 of the number and type of the battery 4B to be replaced with the battery of the electric vehicle 1 and makes a reservation of replacement of the battery 4B (step S39).

After that, the electric vehicle 1 and the battery station car 4 set the route information notified from the management server 30 to the respective autonomous traveling devices and move to the meeting place by autonomous traveling (steps S40 and S41). Then, upon meeting the battery station car 4 at the meeting place, the electric vehicle 1 stops at a designated location of the battery station car 4 by the autonomous traveling function. Then, the battery replacement device 4A of the battery station car 4 automatically replaces the battery of the electric vehicle 1 (steps S42 and S43).

As described above, according to the information processing system in this example embodiment, in consideration of the battery status such as the remaining battery charge level of the electric vehicle 1, the battery station car 4 at which the electric vehicle 1 can arrive and the route thereto are specified. Therefore, the electric vehicle 1 can reach the battery station car 4 without running out of battery, and it is possible to realize replenishment and replacement of the battery.

Third Example Embodiment

Next, a third example embodiment of the present invention will be described with reference to FIG. 9. FIG. 9 is a block diagram showing the configuration of an information processing apparatus in the third example embodiment. In this example embodiment, the configuration of the information processing system described in the first and second example embodiments, specifically, the configuration of the management server 30 will be schematically shown.

As shown in FIG. 9, an information processing apparatus 100 in this example embodiment includes: an acquisition unit 110 configured to acquire location information of an electric vehicle equipped with a removable and replaceable battery, and acquire a status of the battery installed in the electric vehicle; and a specifying unit 120 configured to specify a place where two or more electric vehicles can meet, on a basis of the location information of each of the electric vehicles and the status of the battery.

The acquisition unit 110 and the specifying unit 120 described above may be constructed by an arithmetic device executing a program, or may be constructed by an electronic circuit.

Then, the information processing apparatus 100 with the above configuration operates so as to perform a process of: acquiring location information of an electric vehicle equipped with a removable and replaceable battery, and acquiring a status of the battery installed in the electric vehicle; and specifying a place where two or more electric vehicles can meet, on a basis of the location information of each of the electric vehicles and the status of the battery.

According to the information processing apparatus 100 described above, in consideration of the status of the battery such as the remaining battery charge level of each of the two or more electric vehicles, a place where the electric vehicles can meet is specified. Therefore, the electric vehicle can meet the other electric vehicle at the meeting place without running out of battery and realize replenishment and replacement of the battery.

<Supplementary Notes>

The whole or part of the example embodiments disclosed above can be described as the following supplementary notes. Below, the configurations of an information processing apparatus, a program and an information processing method of the present invention will be described schematically. However, the present invention is not limited to the following configurations.

(Supplementary Note 1)

An information processing apparatus, comprising:

an acquisition unit configured to acquire location information of an electric vehicle equipped with a removable and replaceable battery, and acquire a status of the battery installed in the electric vehicle; and a specifying unit configured to specify a place where two or more electric vehicles can meet, on a basis of the location information of each of the electric vehicles and the status of the battery.

(Supplementary Note 2)

The information processing apparatus according to Supplementary Note 1, wherein:

the acquisition unit is configured to acquire a remaining battery charge level of the battery; and the specifying unit is configured to specify the place where the two or more electric vehicles can meet, on a basis of the remaining battery charge level of the battery of each of the electric vehicles and a route between the electric vehicles based on the location information of each of the electric vehicles.

(Supplementary Note 3)

The information processing apparatus according to Supplementary Note 1 or 2, wherein the specifying unit is configured to specify the place where the two or more electric vehicles can meet, on a basis of a condition of a route between the electric vehicles based on the location information of each of the electric vehicles.

(Supplementary Note 4)

The information processing apparatus according to any of Supplementary Notes 1 to 3, wherein:

the acquisition unit is configured to acquire a vehicle status representing a status of the electric vehicle other than the status of the battery; and the specifying unit is configured to specify the place where the two or more electric vehicles can meet, on a basis of the vehicle status of each of the electric vehicles and a route between the electric vehicles based on the location information of each of the electric vehicles.

(Supplementary Note 5)

The information processing apparatus according to any of Supplementary Notes 1 to 4, wherein the specifying unit is configured to select two or more electric vehicles that replace the batteries with each other, on a basis of the status of the battery acquired from each of the electric vehicles, and specify a place where the selected electric vehicles can meet.

(Supplementary Note 6)

The information processing apparatus according to any of Supplementary Notes 1 to 4, further comprising a control unit configured to, in a case where the electric vehicle has an autonomous traveling device, control the autonomous traveling device so that the electric vehicle autonomously travels to the specified place where the electric vehicles can meet.

(Supplementary Note 7)

A non-transitory computer-readable medium for storing a program comprising instructions for causing an information processing apparatus to realize:

an acquisition unit configured to acquire location information of an electric vehicle equipped with a removable and replaceable battery, and acquire a status of the battery installed in the electric vehicle; and a specifying unit configured to specify a place where two or more electric vehicles can meet, on a basis of the location information of each of the electric vehicles and the status of the battery.

(Supplementary Note 8)

An information processing method, comprising:

acquiring location information of an electric vehicle equipped with a removable and replaceable battery, and acquiring a status of the battery installed in the electric vehicle; and specifying a place where two or more electric vehicles can meet, on a basis of the location information of each of the electric vehicles and the status of the battery.

(Supplementary Note 9)

The information processing method according to Supplementary Note 8, further comprising:

acquiring a remaining level of the battery; and specifying the place where the two or more electric vehicles can meet, on a basis of the remaining battery charge level of the battery of each of the electric vehicles and a route between the electric vehicles based on the location information of each of the electric vehicles.

(Supplementary Note 10)

The information processing method according to Supplementary Note 8 or 9, further comprising specifying the place where the two or more electric vehicles can meet, on a basis of a condition of a route between the electric vehicles based on the location information of each of the electric vehicles.

(Supplementary Note 11)

The information processing method according to any of Supplementary Notes 8 to 10, further comprising:

acquiring a vehicle status representing a status of the electric vehicle other than the status of the battery; and specifying the place where the two or more electric vehicles can meet, on a basis of the vehicle status of each of the electric vehicles and a route between the electric vehicles based on the location information of each of the electric vehicles.

(Supplementary Note 12)

The information processing method according to any of Supplementary Notes 8 to 11, further comprising selecting two or more electric vehicles that replace the batteries with each other, on a basis of the status of the battery acquired from each of the electric vehicles, and specifying a place where the selected electric vehicles can meet.

(Supplementary Note 13)

The information processing method according to any of Supplementary Notes 8 to 12, further comprising, in a case where the electric vehicle has an autonomous traveling device, controlling the autonomous traveling device so that the electric vehicle autonomously travels to the specified place where the electric vehicles can meet.

The above-described program is stored in a storage device or recorded on a computer-readable recording medium. For example, the recording medium is a portable medium such as a flexible disk, an optical disk, a magneto-optical disk, and a semiconductor memory.

Although the present invention has been described above with reference to the example embodiments, the present invention is not limited to the example embodiments. The configurations and details of the present invention can be changed in various manners that can be understood by one skilled in the art within the scope of the present invention.

EXPLANATION OF REFERENCE NUMERALS 1 electric vehicle
1B battery
10 vehicle terminal
11 vehicle status detection part
12 route setting part
30 management server
31 information acquisition part
32 route calculation part
33 replacement management part
34 map information storage part
36 vehicle information storage part
37 station information storage part
4 battery station car
4A battery replacement device
4B battery
40 station car terminal
41 battery status detection part
42 route setting part
43 battery replacement control part
100 information processing apparatus
110 acquisition unit
120 specifying unit

The invention claimed is:

1. An information processing apparatus, comprising:
a memory storing instructions; and
at least one processor configured to execute the instructions, the instructions comprising:
acquiring location information of an electric vehicle equipped with a removable and replaceable battery, and acquiring a status of the battery installed in the electric vehicle; and
specifying a place where two or more electric vehicles can meet, on a basis of an inclination of a road on a route between the electric vehicles based on the location information of each of the electric vehicles and the status of the battery.

2. The information processing apparatus according to claim 1, wherein the instructions further comprise selecting two or more electric vehicles that replace the batteries with each other, on a basis of the status of the battery acquired from each of the electric vehicles, and specifying a place where the selected electric vehicles can meet.

3. The information processing apparatus according to claim 1, wherein the instructions further comprise, in a case where the electric vehicle has an autonomous traveling device, controlling the autonomous traveling device so that the electric vehicle autonomously travels to the specified place where the electric vehicles can meet.

4. An information processing apparatus, comprising:
a memory storing instructions, and
at least one processor configured to execute the instructions, the instructions comprising:
acquiring location information of an electric vehicle equipped with a removable and replaceable battery, acquiring a status of the battery installed in the electric vehicle, and acquiring an operation status of an air conditioner of the electric vehicle; and
specifying a place where two or more electric vehicles can meet, on a basis of a route between the electric vehicles based on the location information of each of the electric vehicles, the status of the battery, and the operation status of the air conditioner of each of the electric vehicles.

5. An information processing method, comprising:
acquiring location information of an electric vehicle equipped with a removable and replaceable battery, and acquiring a status of the battery installed in the electric vehicle; and
specifying a place where two or more electric vehicles can meet, on a basis of an inclination of a road on a route between the electric vehicles based on the location information of each of the electric vehicles and the status of the battery.

6. The information processing method according to claim 5, further comprising specifying the place where the two or more electric vehicles can meet, on a basis of an inclination of a road on the route representing a condition of the route between the electric vehicles based on the location information of each of the electric vehicles.

7. The information processing method according to claim 5, further comprising:
acquiring an operation status of an air conditioner of the electric vehicle as a vehicle status representing a status of the electric vehicle other than the status of the battery; and
specifying the place where the two or more electric vehicles can meet, on a basis of the operation status of the air conditioner of the electric vehicle representing the vehicle status of each of the electric vehicles and a route between the electric vehicles based on the location information of each of the electric vehicles.

8. The information processing method according to claim 5, further comprising selecting two or more electric vehicles that replace the batteries with each other, on a basis of the status of the battery acquired from each of the electric vehicles, and specifying a place where the selected electric vehicles can meet.

9. The information processing method according to claim 5, further comprising, in a case where the electric vehicle has an autonomous traveling device, controlling the autonomous traveling device so that the electric vehicle autonomously travels to the specified place where the electric vehicles can meet.

* * * * *